(12) United States Patent
Carbone et al.

(10) Patent No.: US 11,143,806 B1
(45) Date of Patent: Oct. 12, 2021

(54) ELECTRONIC DEVICES HAVING PIXELS WITH ELEVATED FILL FACTORS

(71) Applicant: Apple Inc., Cupertino, CA (US)

(72) Inventors: Giovanni Carbone, Palo Alto, CA (US); Cheng Chen, San Jose, CA (US); Enkhamgalan Dorjgotov, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 569 days.

(21) Appl. No.: 15/709,729

(22) Filed: Sep. 20, 2017

Related U.S. Application Data (60) Provisional application No. 62/466,668, filed on Mar. 3, 2017.

(51) Int. Cl.
| | |
|---|---|
| *G09G 3/3225* | (2016.01) |
| *G06F 1/16* | (2006.01) |
| *H01L 27/32* | (2006.01) |
| *F21V 8/00* | (2006.01) |
| *G02B 3/00* | (2006.01) |
| *H01L 51/52* | (2006.01) |

(52) U.S. Cl.
CPC .......... *G02B 6/0006* (2013.01); *G02B 3/0056* (2013.01); *G06F 1/163* (2013.01); *G09G 3/3225* (2013.01); *H01L 27/3216* (2013.01); *H01L 27/3244* (2013.01); *H01L 51/5275* (2013.01); *G09G 2320/0257* (2013.01); *G09G 2354/00* (2013.01)

(58) Field of Classification Search
None
See application file for complete search history.

(56) References Cited

U.S. PATENT DOCUMENTS

| | | | |
|---|---|---|---|
| 6,587,618 B2 | 7/2003 | Raguin et al. | |
| 7,145,611 B2 | 12/2006 | Dubin et al. | |
| 8,294,987 B1 | 10/2012 | van Nuland | |
| 9,336,729 B2 | 5/2016 | Jepsen et al. | |
| 9,946,075 B1* | 4/2018 | Hu | G02B 27/0172 |
| 2004/0190762 A1* | 9/2004 | Dowski, Jr. | G02B 5/284 |
| | | | 382/128 |
| 2004/0234188 A1 | 11/2004 | Kerr et al. | |
| 2008/0144174 A1 | 6/2008 | Lucente et al. | |
| 2010/0046560 A1* | 2/2010 | Liu | G02B 6/02328 |
| | | | 372/6 |

(Continued)

*Primary Examiner* — Duane N Taylor, Jr.
(74) *Attorney, Agent, or Firm* — Treyz Law Group, P.C.; G. Victor Treyz; Joseph F. Guihan (57) ABSTRACT

An electronic device with a display may be provided with an array of pixels each of which includes subpixels formed from organic light-emitting diodes. The electronic device may have support structures such as a head-mountable frame or other head-mountable support structure. Optical structures such as lenses may be provided through which the array of pixels is viewable by a user. The array of pixels and the lenses or other optical structures may be supported by the head-mounted support structure. Light spreading structures may overlap the array of pixels to enhance the fill factor of the pixels. The light spreading structures may be formed from a fiber bundle layer, an array of microlenses, or other optical structures that laterally spread light that has been emitted by the organic light-emitting diodes and thereby enhances the fill factor of the pixels.

10 Claims, 8 Drawing Sheets

(56) References Cited

U.S. PATENT DOCUMENTS

| | | | |
|---|---|---|---|
| 2014/0037257 A1* | 2/2014 | Yang | G02B 6/0078 |
| | | | 385/116 |
| 2017/0219824 A1* | 8/2017 | Kress | G02B 27/0172 |
| 2017/0227707 A1* | 8/2017 | Lee | G02B 6/08 |
| 2018/0017227 A1* | 1/2018 | Greene | G02B 6/0006 |
| 2018/0024286 A1* | 1/2018 | Schubert | G02B 6/0006 |
| | | | 362/553 |
| 2018/0172942 A1* | 6/2018 | Bauco | G02B 6/3873 |

* cited by examiner

ELECTRONIC DEVICES HAVING PIXELS WITH ELEVATED FILL FACTORS

This application claims the benefit of U.S. provisional patent application No. 62/466,668, filed on Mar. 3, 2017 which is hereby incorporated by reference herein in its entirety.

BACKGROUND

This relates generally to displays and, more particularly, to head-mounted displays.

Head-mounted displays may have display panels and lenses. Lenses may be used to magnify images displayed on a display panel. If care is not taken, the images that are presented to a user of a head-mounted display will contain visual artifacts. For example, display panels may be subject to unwanted screen door effects. Screen door effects occur when pixels have low fill factors and can be intensified when images are magnified using lenses in a head-mounted display.

SUMMARY

A head-mounted display such as a virtual reality headset may be provided with a pixel array formed from a display panel with an array of organic light-emitting diodes. The pixel array may be mounted to a head-mounted support structure. Optical structures such as lenses may also be mounted to the head-mounted support structure. Images on the pixel array may be viewed by a user through the optical structures.

The fill factor of the pixels in the pixel array may be enhanced by forming light spreading structures over the organic light-emitting diodes. The light spreading structures may laterally spread light that is being emitted by the organic light-emitting diodes and may thereby increase the fill factor of the pixels an enhanced value such as 90% or more.

The light spreading structures may be formed from a fiber bundle layer, an array of microlenses, or other optical structures that are configured to laterally spread emitted light from the organic light-emitting diodes in the pixels. A fiber bundle layer may be formed from a layer of fibers each of which overlaps a respective one of the pixels. An array of microlenses may be formed on the pixel array so that each microlens overlaps one, two, three, or other suitable number of organic light-emitting diodes.

DETAILED DESCRIPTION

Head-mounted displays may be used for virtual reality and augmented reality systems. For example, a virtual reality headset that is worn on the head of a user may be used to provide a user with virtual reality content.

Figure 1:
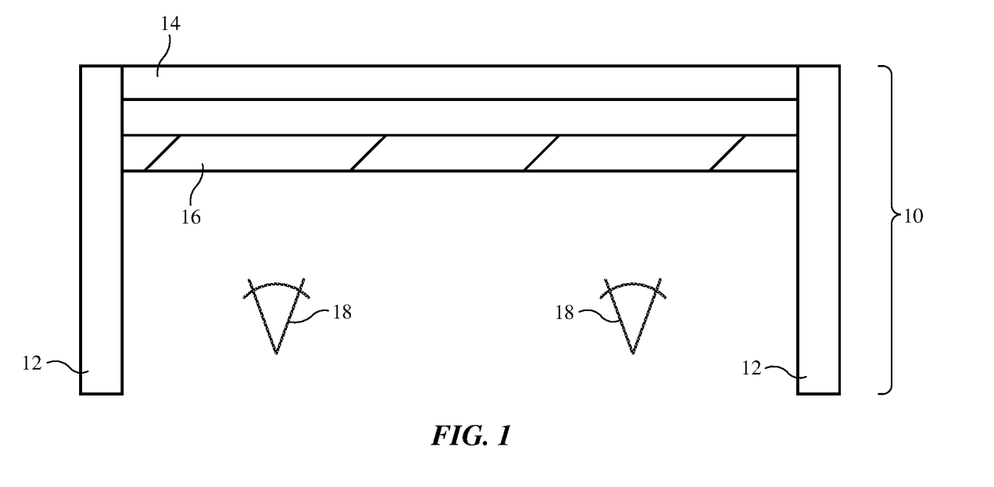
FIG. 1 is a diagram of an illustrative head-mounted display in accordance with an embodiment.

An illustrative system in which a head-mounted display is used in providing a user with virtual reality content and/or augmented reality content is shown in FIG. 1. As shown in FIG. 1, head-mounted display 10 may include a display such as display 14 (sometimes referred to as a display panel or pixel array). Display 14 may be mounted to frame 12 or other head-mountable support structures that allow display 14 to be mounted on the head of a user.

Display 14 may have an opaque substrate or may be transparent. Any suitable display technology may be used in forming the pixels of display 14. As an example, display 14 may be an organic light-emitting diode display or other display having an array of organic light-emitting diode pixels that display images for viewer 18. Images on the pixel array of display 14 may be viewed by user's eyes 18 through an optical system such as optical system 16. Optical system 16 may be mounted to frame 12 or other head-mounted display support structures.

Optical system 16 may include one or more lenses. For example, optical system 16 may include a first lens that focuses images on a left-hand portion of display 14 for viewing by a left-hand user's eye 18 and may include a second lens that focuses images on a right-hand portion of display 14 for viewing by a right-hand user's eye 18.

If desired, head-mounted display 10 may have beam splitters and/or other optical combiners that are used to merge real-world images with images from display 14 (e.g., to provide a user with an augmented reality experience), display 10 may include one or more cameras to capture images that are displayed on display 14 (e.g., for augmented reality), head-mounted display 10 may be a virtual reality headset (e.g., display 14 may be opaque and/or may be mounted in opaque portions of support structure 12 that block ambient light), and/or other configurations may be used for head-mounted display 10. The configuration of FIG. 1 is merely illustrative.

Display 14 may be based on a liquid crystal display, an organic light-emitting diode display, a display having an array of crystalline semiconductor light-emitting diode dies, and/or displays based on other display technologies. Separate left and right display panels may be included in head-mounted display 10 for the user's left and right eyes or a single display panel may span both eyes 18.

Visual content (e.g., image data for still and/or moving images) may be provided to display 14 using control circuitry that is mounted in head-mounted display 10 and/or control circuitry that is mounted outside of head-mounted display 10 (e.g., in an associated portable electronic device, laptop computer, or other computing equipment). The control circuitry may include storage such as hard-disk storage, volatile and non-volatile memory, electrically programmable storage for forming a solid-state drive, and other memory. The control circuitry that provides images for displaying on display 14 of head-mounted display 10 may also include one or more microprocessors, microcontrollers, digital signal processors, graphics processors, baseband processors, application-specific integrated circuits, and other processing circuitry. Communications circuits in head-mounted display 10 may be used to transmit and receive data (e.g., wirelessly and/or over wired paths).

Control circuitry in head-mounted display 10 may use display 14 to display visual content such as virtual reality content (e.g., computer-generated content associated with a virtual world), pre-recorded video for a movie or other media, or other images. Illustrative configurations in which the control circuitry of head-mounted display 10 provides a user with virtual reality content using display 14 may sometimes be described herein as an example. In general, however, any suitable content may be presented to a user by the control circuitry of head-mounted display 10 using display 14 and optical system (lenses) 16.

Figure 2:
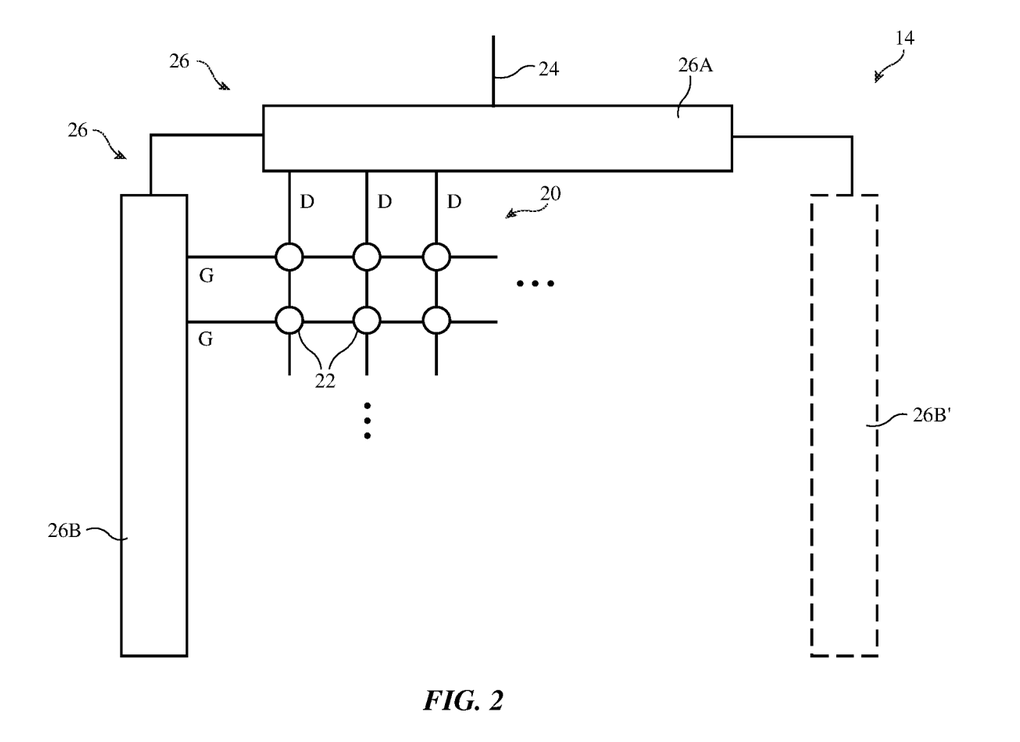
FIG. 2 is a diagram of an illustrative pixel array in a head-mounted display in accordance with an embodiment.

FIG. 2 is a diagram of an illustrative display such as display 14 of FIG. 1. Display 14 may include a source of images such as pixel array 20. Pixel array 20 may be formed from a two-dimensional array of pixels 22 (e.g., organic light-emitting diode pixels, liquid crystal display pixels, etc.). Pixels 22 may be arranged in rows and columns. Columns of pixels 22 may be provided with data over data lines D. Rows of pixels may be controlled using horizontal control signals (sometimes referred to as scan signals, emission enable signals, gate line signals, etc.) that are provided to the pixels using one or more gate lines G in each row.

Control circuitry in head-mounted display 10 may provide display 14 with image data via path 24. Display 14 may include display driver circuitry 26. Display driver circuitry 26 may include data line (column) driver circuitry 26A and gate line driver circuitry 26B. Circuitry 26A and 26B may be formed using one or more integrated circuits and/or thin-film transistor circuitry. With one illustrative configuration, driver circuitry 26A may receive image data via path 24 and may provide corresponding data signals to columns of pixels 22 via data lines D while supplying clock and control signals to gate line driver circuitry 26B. Gate line driver circuitry 26B may supply gate line control signals to rows of pixels 22 based on the clock and control signals received from display driver circuitry 26A. There may be gate line driver circuitry 26B on one or more edges of pixel array 20. For example, gate line driver circuitry 26B may be formed on the left-hand edge of display 14 and/or gate line driver circuitry 26B' may be formed on the right-hand edge of display 14.

To reduce weight and ensure that head-mounted display 10 is compact and not too bulky, it may be desirable to form display 14 from lightweight display structures such as a lightweight organic light-emitting diode display panel or a lightweight display panel having an array of light-emitting diodes formed from respective crystalline semiconductor dies (as examples). A cross-sectional side view of an illustrative organic light-emitting diode display formed from thin-film circuitry is shown in FIG. 3.

Figure 3:
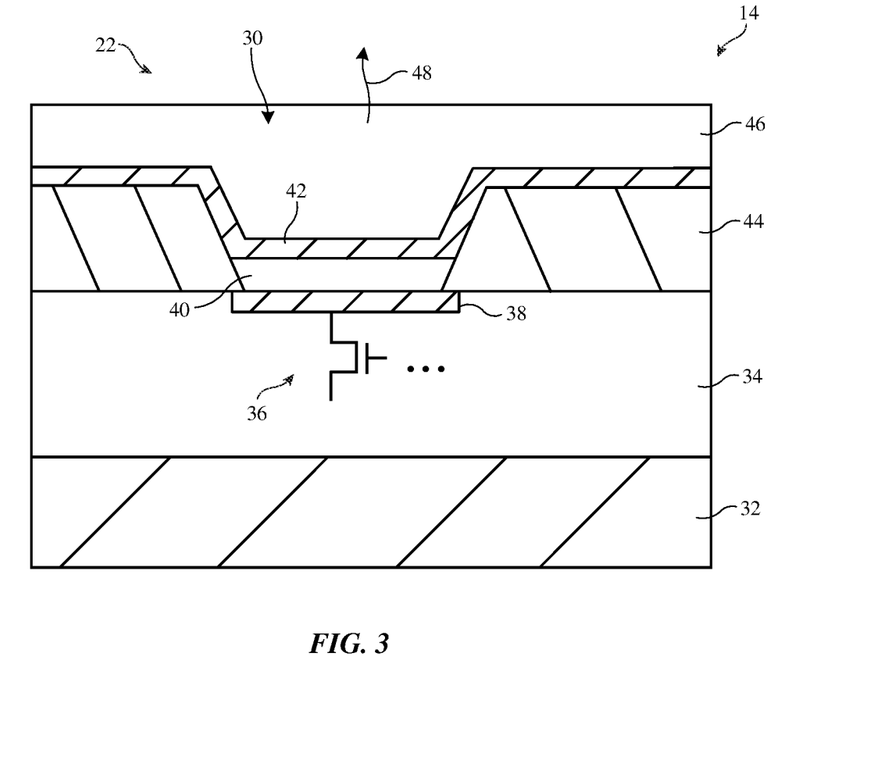
FIG. 3 is a cross-sectional side view of an illustrative organic light-emitting diode display for a device such as a head-mounted display in accordance with an embodiment.

As shown in FIG. 3, display 14 may have a substrate such as substrate 32. Substrate 32 may be formed from glass, polymer, and/or other materials. Thin-film circuitry 34 may be formed from layers of dielectric, metal, and semiconductors and may include thin-film capacitors, interconnect lines, and thin-film devices such as thin-film transistor 36. For example, a layer of thin-film circuitry such as circuitry 34 may include thin-film transistors that serve as switching transistors, emission enable transistors, drive transistors, and other pixel circuit transistors. Thin-film layers may be deposited and patterned on thin-film circuitry 34 to form organic light-emitting diodes for pixels 22 such as illustrative light-emitting diode 30 of FIG. 3.

Each light-emitting diode 30 may include a layer of organic emissive material 40 interposed between an anode such as anode 38 and a cathode such as cathode 42. Anodes 38 may be formed from a patterned metal layer deposited on the upper surface of thin-film circuit layer 34. Cathode 42 may be formed from a blanket conductive film (e.g., a film of transparent conductive material such as indium tin oxide and/or a layer of one or more metals that is sufficiently thin to be transparent). Light-emitting diode 30 may be formed in an opening in pixel definition layer 44. Pixel definition layer 44 may be formed from a layer of polymer. Overcoat layer 46 may be formed from one or more transparent materials (e.g., polymer, inorganic materials, etc.). Overcoat layer 46 may help planarize and protect the array of diodes 30 formed on substrate 32 (e.g., overcoat layer 46 may serve as an encapsulation layer for thin-film circuitry such as diodes 30 and the circuitry of layer 34).

During operation, transistors 36 may supply current to organic light-emitting diodes 30 under the control of display driver circuitry 26. This causes light-emitting diodes 30 to emit light 48 and causes the array of pixels 22 in display 14 to display images for a user.

Each pixel 22 of pixel array 20 may include multiple subpixels. The subpixels may have light-emitting diodes of different colors (e.g., red, green, blue, light blue, yellow, etc.). As an example, each pixel 22 of array 20 may have a red subpixel, a green subpixel, and a blue subpixel. The red subpixels of display 14 may have red light-emitting diodes 30 that contain red emissive material 40 and that emit red light 48, the green subpixels of display 14 may have green light-emitting diodes 30 that contain green emissive material 40 and that emit green light 48, and the blue subpixels of display 14 may have blue light-emitting diodes 30 that contain blue emissive material 40 and that emit blue light. Pixels with other numbers of subpixels and/or subpixels of different colors may be used, if desired.

Figure 4:
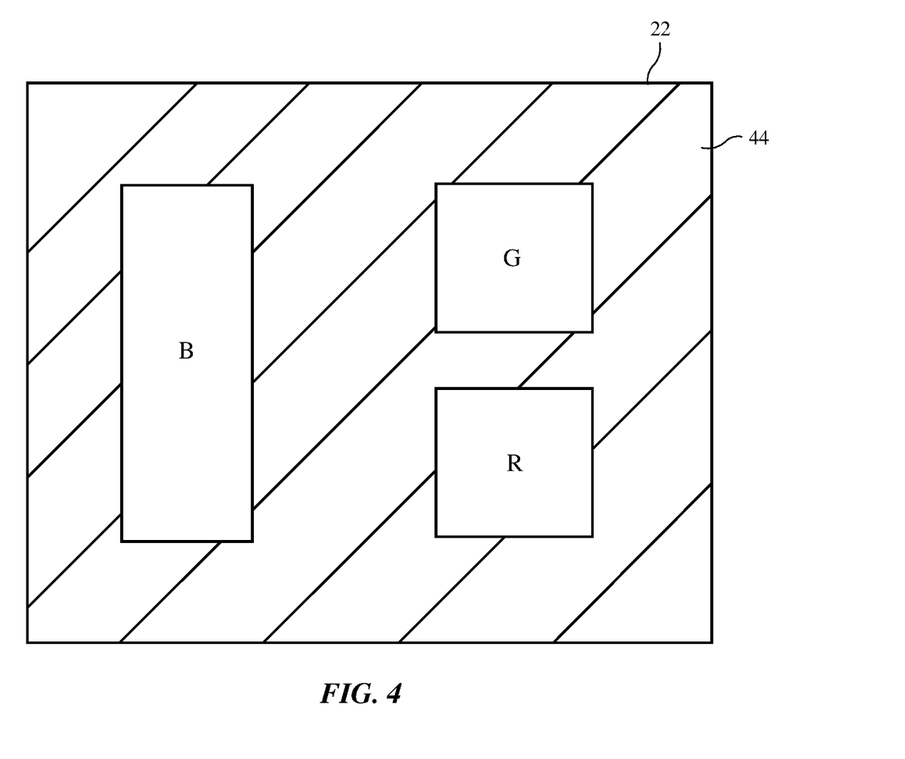
FIG. 4 is a top view of an illustrative pixel having subpixels of three different colors in accordance with an embodiment.

A top view of an illustrative pixel having a blue subpixel B formed from a blue light-emitting diode, a green subpixel G formed from a green light-emitting diode, and a red subpixel R formed from a red light-emitting diode is shown in FIG. 4. Each subpixel may emit light 48 from the region overlapped by the anode 38 of the light-emitting diode 30 in that subpixel. The rest of pixel 22 is covered by pixel definition layer 44 and does not emit light. In pixel 22 of FIG. 4, for example, blue light is emitted from the area overlapping the blue light-emitting diode anode (the area labeled "B" in FIG. 4), red light is emitted from the area overlapping the red light-emitting diode anode (the area labeled "R" in FIG. 4), and green light is emitted from the area overlapping the green light-emitting diode anode (the area labeled "G" in FIG. 4). The ratio of the diode areas (anode areas) emitting light 48 to the total area of pixel 22 is referred to as the fill factor of pixel 22. Low fill factor displays are characterized by relatively large fractions of pixel real estate that do not emit light and therefore contribute to undesired screen door effects. If care is not taken, the fill factor of the pixels in an organic light-emitting diode display may be relatively small (e.g., 20-30%), particularly in high resolution displays of the type that may be desirable for use in head-mounted displays.

To minimize screen door effects and thereby enhance display quality for display 14, pixels 22 of pixel array 20 in display 14 may be provided with light spreading structures that enhance the fill factor for pixels 22. The light spreading structures may be formed from microlenses, a fiber bundle layer (sometimes referred to as a light guide bundle layer or light guide layer), or other optical structures that overlap pixel array 20 and that laterally spread the light 48 that is emitted from each light-emitting diode. This enhances the fill factor for the pixels of display 14 (e.g., the fill factor of display 14 may be at least 0.4, at least 0.5, at least 0.6, at least 0.7, at least 0.8, at least 0.9, at least 0.95, or at least 0.98 even if the fill factor of the underlying light-emitting diode structures is less than 0.3 or other relatively small value).

Fiber bundles may be formed from a set of parallel transparent fibers bound together with a polymer or other binder material. The fibers may, for example, be formed from transparent polymer or glass. After binding the fibers together to form a fiber bundle, the fiber bundle may be divided into individual fiber bundle layers by cutting the fiber bundle into slices (slicing perpendicular to the lengths of the fibers) and by polishing the cut slices. Fibers may have circular cross-sectional shapes, rectangular (e.g., square) cross-sectional shapes, or other suitable cross-sectional shapes. If desired, a bundle of light guides may be formed directly on the thin-film circuitry of a display (e.g., using microfabrication techniques). Fiber bundle layers may also be formed separately and laminated to a pixel array using an adhesive layer (e.g., a transparent overcoat layer) or spaced apart from the display (e.g., by an air gap).

Figure 5:
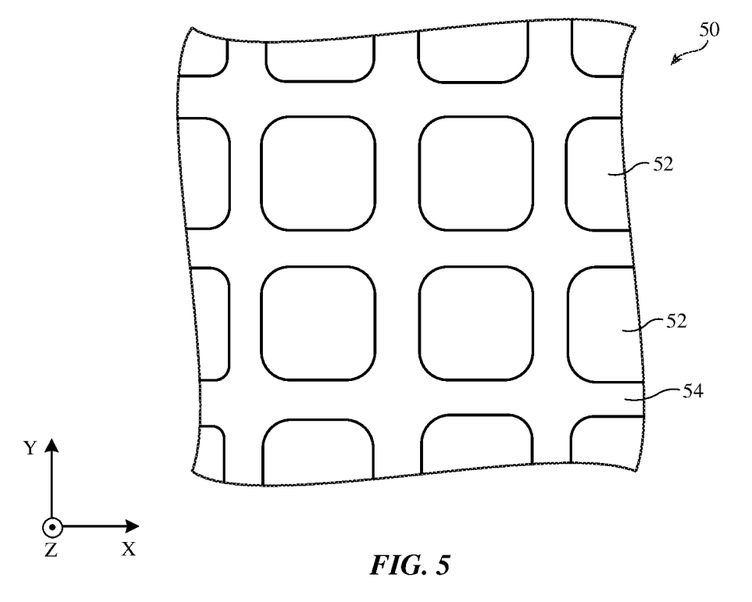
FIG. 5 is a top view of an illustrative fiber bundle layer in accordance with an embodiment.

A top view of an illustrative fiber bundle layer is shown in FIG. 5. As shown in FIG. 5, fiber bundle layer 50 may be formed from an array of fibers 52 that have been bound together using binder 54. Fiber bundle layer 50 may be relatively wide in lateral dimensions X and Y and may be relatively thin in vertical dimension Z. Layer 50 may be planar (e.g., layer 50 may lie in the X-Y plane of FIG. 5) so that layer 50 may be placed on the planar surface of pixel array 20.

During operation, light 48 from underlying light-emitting diodes 30 propagates outwardly through fibers 52 in direction Z. This spreads the light from each light-emitting diode 30 in dimensions X and Y so that the light fills the entire exposed face of an associated overlapping fiber 52. By lateralling spreading the light from light-emitting diodes 30 before this light is viewed by the user, the fraction of display surface area that is consumed by dark areas (see, e.g., pixel definition layer 44 of FIG. 4) is minimized and fill factor is enhanced.

The light guiding properties of fibers 52 may be determined by the relative index of refraction values of fibers 52 and binder 54. The index of refraction of fibers 52 may be na and the index of refraction of binder 52 may be nb. With one illustrative configuration, the value of nb may be less than na to promote light guiding within fibers 52 (along the Z axis of FIG. 5) due to the principal of total internal reflection. The relative values of na and nb may be chosen so that the numerical aperture of fibers 52 is 0.66, 0.6-0.7, 0.6-0.8, 0.5-0.8, more than 0.5, less than 0.8, or other suitable value. It may be desirable to minimize the amount of area consumed by binder 54 relative to the amount of area consumed by fibers 52 in layer 50 to help minimize pixel fill factor as light travels through fiber bundle layer 60. For example, binder 54 may consume less than 50% of the area of layer 50, less than 30% of the area of layer 50, less than 15%, of the area of layer 50, or less than 5% of the area of layer 50 (as examples).

Figure 6:
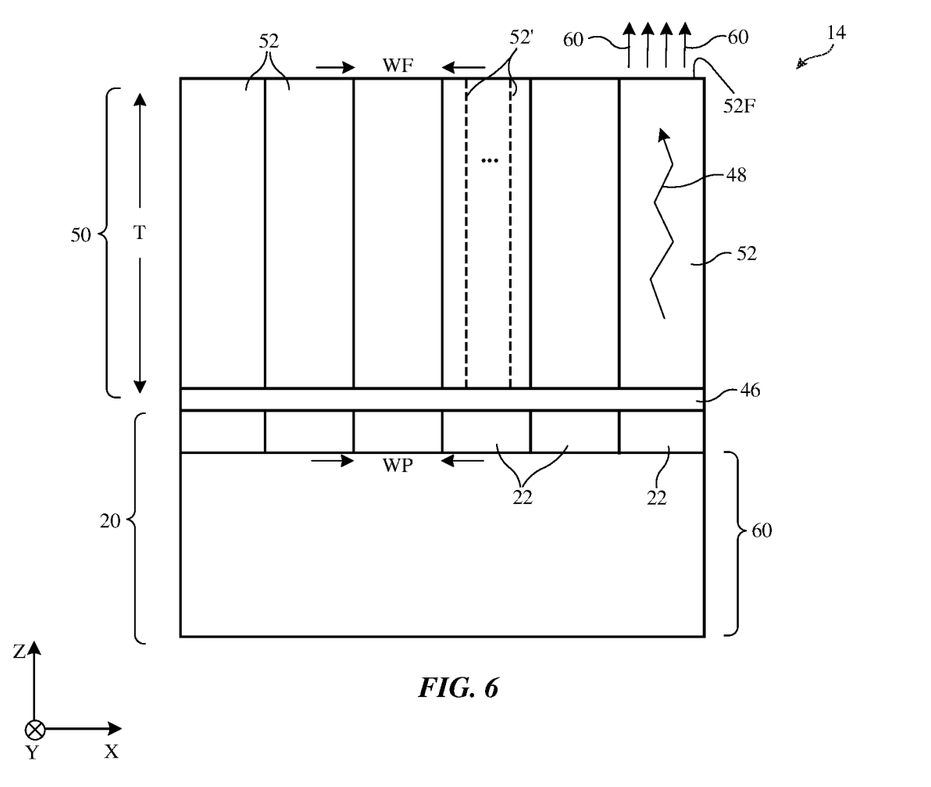
FIG. 6 is a cross-sectional side view of an illustrative display such as an organic light-emitting diode display with a fiber bundle layer in accordance with an embodiment.

A cross-sectional side view of display 14 showing how fiber bundle layer 50 may be formed on top of overcoat layer 46 of pixel array 20 is shown in FIG. 6. Pixel array 20 may include an array of pixels 22 formed on layers(s) 60. Layers 60 may include thin-film transistor circuitry 34, substrate 32, and the other layers of display structures under overcoat layer 46 that are shown in FIG. 3 (as an example).

Each pixel 22 may include a set of red, green, and blue light-emitting diodes 30 that emits light 48. Light 48 is guided upwardly along dimension Z within each overlapping fiber 52 and is emitted as light 60 at the exposed upper face 52F of that fiber 52. In the example of FIG. 6, there is a one-to-one relationship between the fibers 52 in layer 50 and the pixels 22 of pixel array 20. If desired, there may be more fibers 52 than pixels 22 or more pixels 22 than fibers 52. As an example, the density (number of fibers per unit area) of fibers 52 may be larger than the density of pixels 22 (number of pixels per unit area) by a factor of at least 2, at least 4, at least 10, 2-10, at least 20, less than 1000, or other suitable amount. In some configurations, each fiber 52 overlaps a respective subpixel in each pixel 22 or other suitable subset of a pixel. In configurations in which the density of pixels 22 is much larger than the density of pixels 22, each fiber overlaps a relatively small fraction of a pixel and each pixel 22 overlaps multiple fibers 52 (e.g., each pixel 22 overlaps 2-100 fibers 52, 2-30 fibers 52, at least 2 fibers 52, at least 5 fibers 52, at least 15 fibers 52, at least 30 fibers 52, fewer than 200 fibers 52, or other suitable number of fibers). Dashed lines 52' show how multiple fibers 52 may overlap each pixel 22 (e.g., in a scenario in which the density of fibers 52 is larger than the density of pixels and/or subpixels in display 14). If desired, some or all of overcoat 46 may be removed (e.g., to space the lower surfaces of fibers 52 by an air gap from pixels 22)

The thickness T of fiber bundle layer 50 is preferably sufficiently large to ensure that light 48 is homogenized (scrambled) while propagating upwardly in direction Z. For example, thickness T may be 0.5 mm to 10 mm, 0.5 to 2 mm, at least 0.2 mm, at least 0.4 mm, at least 0.5 mm, 0.5 to 2 mm, less than 5 mm, less than 1 mm, or other suitable thickness. The lateral X and Y dimensions (dimension WP) of each pixel 22 and therefore the lateral X and Y dimensions (dimension WF) of each fiber 52 may be 30-70 microns, at least 10 microns, at least 20 microns, at least 30 microns, less than 100 microns, less than 50 microns, less than 30 microns, or other suitable size. Fibers 52 may have circular cross sections, rectangular cross sections (e.g., square, square with rounded corners, etc.), or other suitable shapes.

Figure 7:
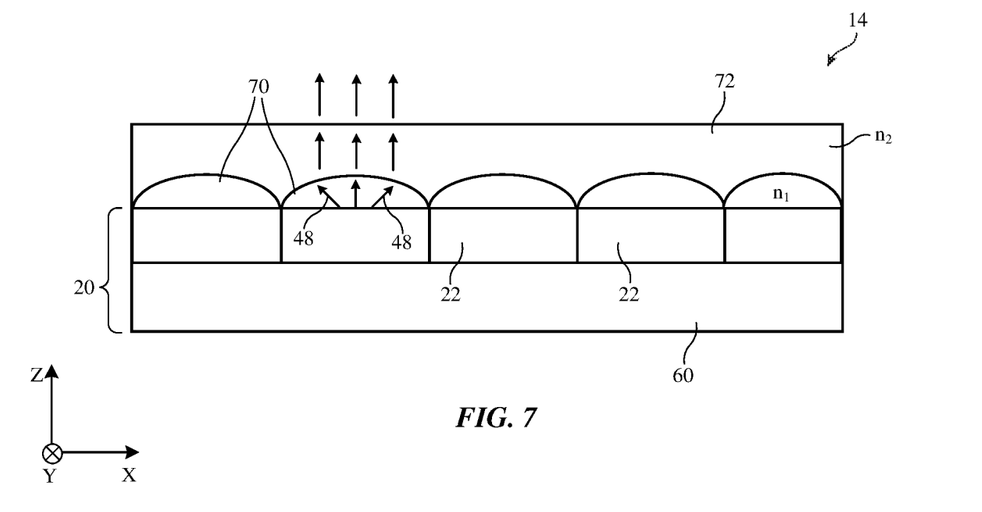
FIG. 7 is a cross-sectional side view of an illustrative display such as an organic light-emitting diode display having pixels with microlenses for enhancing fill factor in accordance with an embodiment.

FIG. 7 is a cross-sectional side view of display 14 in an illustrative configuration in which light scattering structures have been formed from microlenses. As shown in FIG. 7, display 14 may include pixel array 20. Pixel array 20 may be formed form an array of pixels 22 on layer(s) 60 (e.g., a substrate layer, one or more layers of thin-film circuitry, etc.). Each pixel 22 may contain red, green, and blue subpixels or may include subpixels of other colors.

A patterned layer of microlenses 70 may be formed on pixel array 20. As one example, each pixel 22 may be overlapped by a corresponding microlens 70. Configurations for display 14 in which each pixel 22 is overlapped by a different number of microlenses 70 (e.g., more than one microlens per pixel) may also be used.

Lenses 70 and pixels 22 may have lateral dimensions X and Y of 30-70 microns, at least 10 microns, at least 20 microns, at least 30 microns, less than 100 microns, less than 50 microns, less than 30 microns, or other suitable size. Light 48 that is emitted upwardly in direction Z may be laterally spread and collimated by passing through lenses 70, as shown in FIG. 7. Lenses 70 may be formed from inorganic materials and/or organic materials (e.g., transparent polymer).

Lenses 70 may be covered with transparent coating layer 72. Transparent coating layer 72 may be formed from a polymer or other material having an index of refraction n2 that is more than the index of refraction n1 of lenses 70 so that lenses 70 act as negative lenses and help to collimate (concentrate) emitted light towards user's eyes 18. Because each lens 70 spreads light 48 laterally, light 48 will be emitted over portions of the surface of display 14 that otherwise would contain non-light-emitting structures such as portions of pixel definition layer 44. Microlens 70 (or other light spreading structures such as fibers 52 in fiber bundle layer 50) therefore spread light laterally so that pixel fill factor is enhanced and screen door effects in display 14 are minimized.

Figure 8:
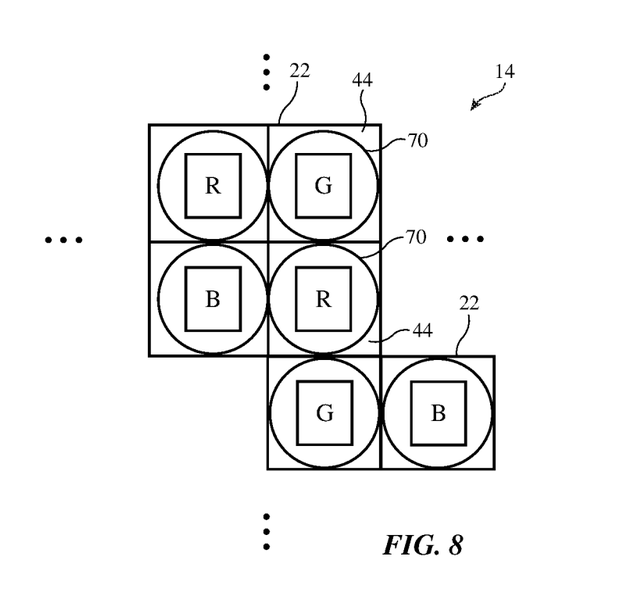
FIGS. 8 and 9 are top views of illustrative subpixel patterns for displays with microlenses in accordance with an embodiment.
Figure 9:
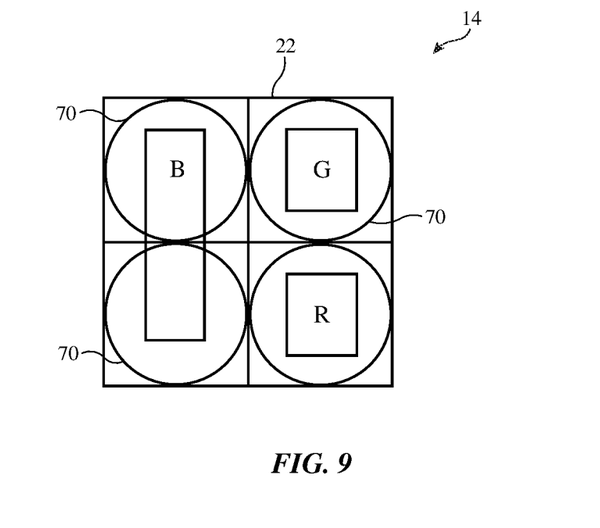

Illustrative microlens layouts for display 14 in which each microlens covers a subset of a pixel are shown in FIGS. 8 and 9. In the example of FIG. 8, each pixel 22 has a red subpixel formed from a red diode R, a green subpixel formed from a green diode G, and a blue subpixel formed from a blue diode B and each of these subpixels is overlapped by a corresponding microlens 70. In the example of FIG. 9, the blue diode B (e.g., the blue anode area) that forms the blue subpixel of pixel 22 is larger than the red and green diodes R and G (to help compensate for weaker blue organic light-emitting diode light emission). In this type of arrangement, a pair of microlenses 70 may overlap each blue light-emitting diode and a single respective microlens 70 may overlap each of the red and green light-emitting diodes. Other patterns of microlenses and light-emitting diodes may be used in forming display 14 if desired. For example, odd rows of pixel array 20 may contain alternating red and green subpixels and even rows in pixel array 20 may contain alternating green and blue subpixels, etc. In general, each microlens 70 may overlap 1-3 subpixels, fewer than 4 subpixels, more than 1 subpixel, or other suitable numbers of subpixels. The examples of FIGS. 7 and 8 are merely illustrative.

The foregoing is merely illustrative and various modifications can be made to the described embodiments. The foregoing embodiments may be implemented individually or in any combination.

What is claimed is:

1. An electronic device with a display configured to display images viewable by a user, comprising:
   a head-mounted support structure;
   an array of pixels supported by the support structure, wherein the array of pixels is configured to produce light associated with the images;
   a fiber bundle layer that overlaps the array of pixels; and
   an optical system supported by the head-mounted support structure through which the images are viewable, wherein the array of pixels is formed from a layer of thin-film circuitry containing thin-film transistors, a layer of patterned anodes on the layer of thin-film circuitry, organic emissive material on the anodes, a cathode layer, and an overcoat layer and wherein the overcoat layer is interposed between the fiber bundle layer and the cathode layer.

2. The electronic device defined in claim 1 wherein the fiber bundle layer includes an array of fibers and includes binder that binds the fibers together and wherein the fibers each have a rectangular cross-sectional shape.

3. An electronic device with a display configured to display images viewable by a user, comprising:
   a head-mounted support structure;
   an array of pixels supported by the head-mounted support structure, wherein the array of pixels is configured to produce light associated with the images;
   an array of microlenses, each pixel overlapping at least one microlens; and
   an optical system supported by the head-mounted support structure through which the images are viewable, wherein the array of microlenses is interposed between the array of pixels and the optical system.

4. The electronic device defined in claim 3 wherein the each of the pixels includes first, second, and third light-emitting diodes of different colors and wherein each microlens overlaps the first, second, and third light-emitting diodes of a respective one of the pixels.

5. The electronic device defined in claim 3 wherein each of the pixels includes first, second, and third light-emitting diodes of different colors, wherein each of the first light-emitting diodes is overlapped by a respective one of the microlenses, and wherein each of the second light-emitting diodes is overlapped by a respective one of the microlenses.

6. The electronic device defined in claim 5 wherein each of the third light-emitting diodes is overlapped by a respective one of the microlenses.

7. The electronic device defined in claim 5 wherein each of the third light-emitting diodes is overlapped by a respective pair of the microlenses.

8. The electronic device defined in claim 7 wherein each of the third light-emitting diodes is a blue light-emitting diode.

9. The electronic device defined in claim 3 further comprising a coating layer on the array of microlenses, wherein the microlenses have a first index of refraction and wherein the coating layer has a second index of refraction that is greater than the first index of refraction.

10. An electronic device with a display configured to display images viewable by a user, comprising:
    a support structure;
    an array of pixels supported by the support structure, wherein the array of pixels is configured to produce light associated with the images; and
    a fiber bundle layer that overlaps the array of pixels, wherein the array of pixels is formed from a layer of thin-film circuitry containing thin-film transistors, a layer of patterned anodes on the layer of thin-film circuitry, organic emissive material on the anodes, a cathode layer, and an overcoat layer and wherein the overcoat layer is interposed between the fiber bundle layer and the cathode layer.

* * * * *